US007525469B2

(12) United States Patent
Tsai

(10) Patent No.: US 7,525,469 B2
(45) Date of Patent: Apr. 28, 2009

(54) PSEUDO-DIFFERENTIAL ANALOG FRONT END CIRCUIT AND IMAGE PROCESSING DEVICE

(75) Inventor: Jui-Yuan Tsai, Tai Nan (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/882,717

(22) Filed: Aug. 3, 2007

(65) Prior Publication Data

US 2008/0036640 A1 Feb. 14, 2008

(30) Foreign Application Priority Data

Aug. 11, 2006 (TW) .............................. 95129488 A

(51) Int. Cl.
*H03M 1/12* (2006.01)

(52) U.S. Cl. ...................................... 341/155; 341/161

(58) Field of Classification Search ................. 341/118, 341/120, 155, 161, 172
See application file for complete search history.

(56) References Cited

U.S. PATENT DOCUMENTS

| | | | | |
|---|---|---|---|---|
| 5,371,552 | A * | 12/1994 | Brummette et al. | 348/697 |
| 5,426,461 | A * | 6/1995 | Ohara | 348/254 |
| 7,145,494 | B2 * | 12/2006 | Mizuguchi et al. | 341/155 |
| 2004/0207586 | A1 * | 10/2004 | Tsai et al. | 345/87 |
| 2004/0239545 | A1 | 12/2004 | Tsai et al. | |

OTHER PUBLICATIONS

Dual Interface for Flat Panel Displays, AD9887, pp. 1-56 (Jun. 25, 2001).

* cited by examiner

*Primary Examiner*—Brian Young
(74) *Attorney, Agent, or Firm*—Muncy, Geissler, Olds & Lowe, PLLC

(57) ABSTRACT

An image processing device is provided which includes a pseudo differential analog front end circuit for receiving at least one image analog signal and generating at least one digital signal. The pseudo differential analog front end circuit includes at least a converting circuit, each of which includes a clamper, an input buffer and an analog-to-digital converter. All of the analog-to-digital converters receive a common comparing voltage if the number of the converting circuits is greater than one.

15 Claims, 5 Drawing Sheets

PSEUDO-DIFFERENTIAL ANALOG FRONT END CIRCUIT AND IMAGE PROCESSING DEVICE

BACKGROUND OF THE INVENTION

1. Field of the Invention

The invention relates to display systems, and more particularly, to an image processing device applied to display systems. More specifically, the invention relates to an image processing device having a pseudo-differential analog front end circuit.

2. Description of the Related Art

Many display cards (e.g., VGA card) in computer systems outputs only analog image signals in an analog format, so a liquid crystal display (LCD) is capable of displaying image frames after the analog image signal is converted into a digital image signal. Usually, the liquid crystal display utilizes an analog front end (AFE) circuit to perform signal conversion. Since the analog image signals contain three signals R, G, B, the AFE circuit includes three circuits to process the three signals respectively. A liquid crystal display controller mainly includes the AFE circuit, a scalar and a peripheral circuit. As chip integration increases, the current trend is to integrate the AFE circuit, the scalar and the peripheral circuit into a single chip (or IC).

In practical applications, three analog image signals R, G, B are usually transmitted over a cable or wire by means of single-ended signaling. In order to get rid of noise, the LCD controllers normally perform signal processing over differential signals instead of singled-ended signals, so the received singled-ended signals need to be converted into the differential signals in the interior of the LCD controllers. However, converting singled-ended signals into differential signals may cause a signal distortion problem due to different reference ground levels. The extent of signal distortion is related to the layout of the peripheral circuit and the power configuration inside the IC. If the layout of the ground plane and the power configuration have been arranged well (e.g., a four-layered board) or the IC has a lot of power pins and grounds pins (such as AD 9887), it is possible to make the signal distortion un-obvious.

Accordingly, what is needed is a circuit to address the above-identified problems. The invention addresses such a need.

SUMMARY OF THE INVENTION

In view of the above-mentioned problems, an object of the invention is to provide a pseudo-differential AFE circuit capable of solving problems of signal distortion caused by a singled-ended to differential conversion, having too many components and having too many pins of IC packages.

Another object of the invention is to provide a pseudo-differential AFE circuit in order to enhance the quality characteristic of an input buffer.

To achieve the above-mentioned object, the pseudo-differential AFE circuit is utilized to receive at least one analog image signal and generate at least one digital signal. The pseudo-differential analog front end circuit comprises at least one converting circuit, each of which comprises: a clamper, an input buffer and an analog-to-digital converter(ADC). The clamper receives the analog image signal and restores a DC voltage level of the analog image signal to generate a first restored signal while the input buffer buffers the first restored signal and generates a buffered signal. The ADC has a positive input terminal and a negative input terminal, one of which receives the buffered signal and the other of which receives a comparing voltage. The ADC converts a voltage difference between the two input terminals into the digital signal. Wherein, each of the ADCs receives a common comparing voltage while the number of the at least one converting circuit is greater than one.

Still another object of the invention is to provide an image processing device for processing at least one analog image signal fed from a display card and generating at least one digital signal. The image processing device comprises a peripheral circuit and a pseudo-differential analog front end circuit. The peripheral circuit, having a ground terminal, is electrically coupled with both the display card for transmitting the at least one analog image signal and the pseudo-differential AFE circuit.

A feature of the invention is that each of the ADCs receives a common comparing voltage circuit to form the pseudo-differential AFE circuit. The term "pseudo-differential AFE circuit" refers to front-end circuits connected respectively to the positive input terminal and the negative input terminal of the ADC. In fact, the front-end circuits have pseudo symmetric circuit configuration instead of a fully differential input structure. The invention makes use of the least components and the least number of pins to form the pseudo-differential AFE circuit so as to approximate to an AFE circuit with fully-differential inputs. The invention solves both the signal distortion problem caused by a singled-ended to differential conversion and drawbacks of the AFE circuit with fully-differential inputs, such as having too many components and too many package pins. Therefore, the invention not only reduces the number of components and the number of package pins in the peripheral circuit and the AFE circuit to reduce the power consumption and the size of the analog circuit, but also improves the quality characteristic of the input buffer based on a pseudo-differential input structure, thereby rendering a much better image quality.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The pseudo-differential AFE circuit and image processing device of the invention will be described with reference to the accompanying drawings.

Figure 1A:
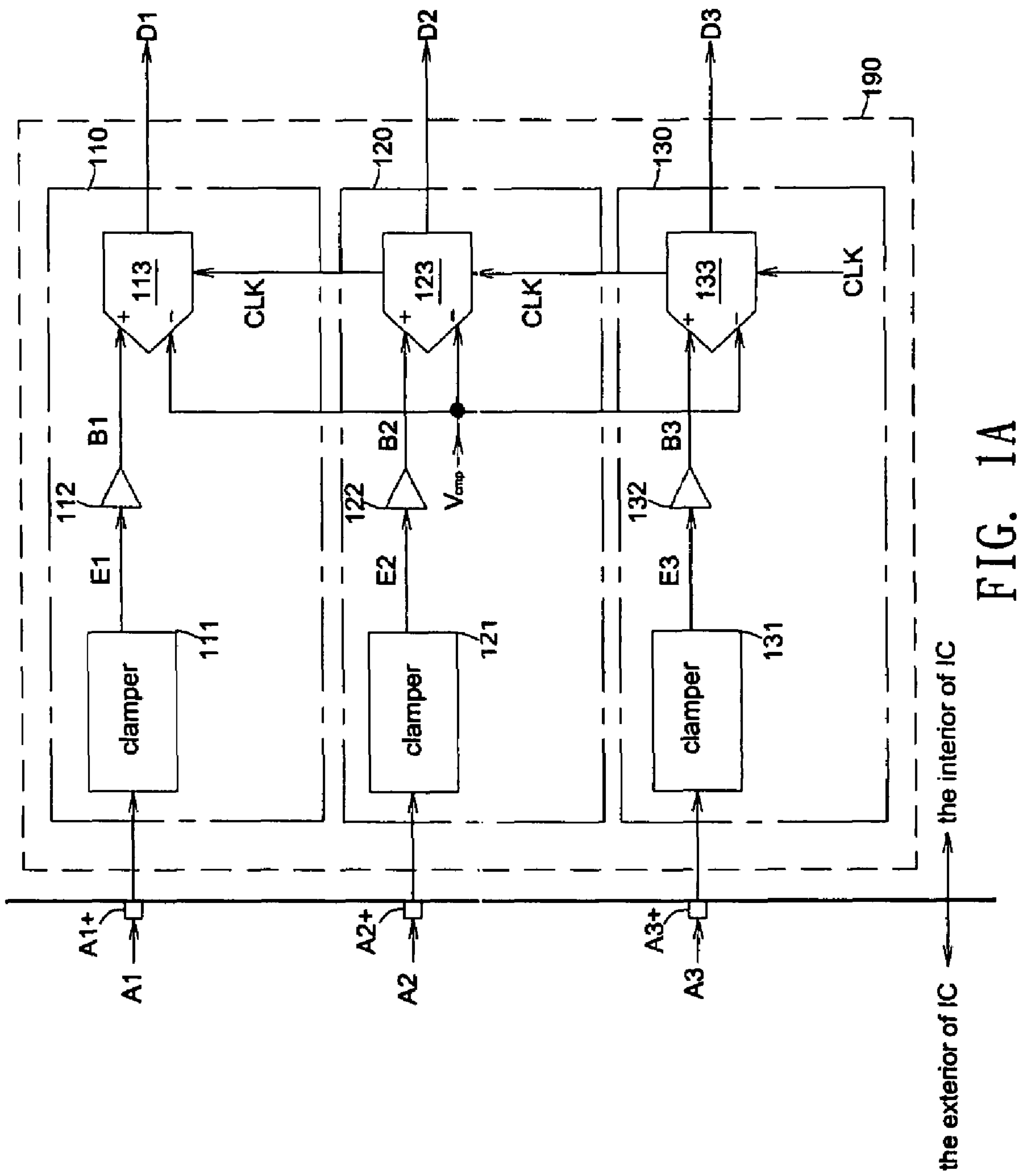
FIG. 1A shows a block diagram illustrating a pseudo-differential AFE device according to the invention.

FIG. 1A shows a block diagram illustrating a pseudo-differential AFE device according to the invention. Referring to FIG. 1A, a pseudo-differential AFE circuit 190 of the invention, including at least one converting circuit (110, 120, 130), used to receive at least one analog image signal (A1, A2, A3) and generate at least one digital signal (D1, D2, D3). Each converting circuit includes a clamper (111, 121, 131), an input buffer (112, 122, 132) and an ADC (113, 123, 113). Take the converting circuit 110 for example. The clamper 111 receives an analog image signal A1 and then restores the DC voltage level of the analog image signal A1 to generate a restored signal E1. The input buffer 112 buffers the restored signal E1 and then outputs a buffered signal B1. The ADC 113 has two input terminals with positive and negative polarities, one of which receives the buffered signal B1 and the other of which receives a comparing voltage $V_{cmp}$. Accordingly, the ADC 113 converts a voltage difference between the two input terminals into the digital signal D1. It should be noted that the architectures and operations of the converting circuits 120, 130 are the same as those of the converting circuit 110 and thus will not be described herein. Each of the ADCs (113, 123, 113) receives a common comparing voltage $V_{cmp}$.

The number of converting circuits relates to types of the analog image signals received by the pseudo-differential AFE circuit 190. For example, while disposed in a LCD controller, the pseudo-differential AFE circuit 190 has to includes three identical converting circuits so as to process three analog image signals R, G, B; while disposed in a video decoder, the pseudo-differential AFE circuit 190 has to include three converting circuits to process three signals Y, Pr, Pb if the received image signal type is a component video signal. While the received image signal type is a separate video (S-video) signal, the pseudo-differential AFE circuit 190 has to include two converting circuits to process two signals Y, C; while the received image signal type is a composite video signal, the pseudo-differential AFE circuit 190 includes only one converting circuits to process the signal CVBS. For clear indication, all signals are designated in the following specification and drawings by A1, A2 and A3, which denote X/C/Pr/R, X/X/Pb/B and CVBS/Y/Y/G, respectively and "X" represents no signal.

Figure 1B:
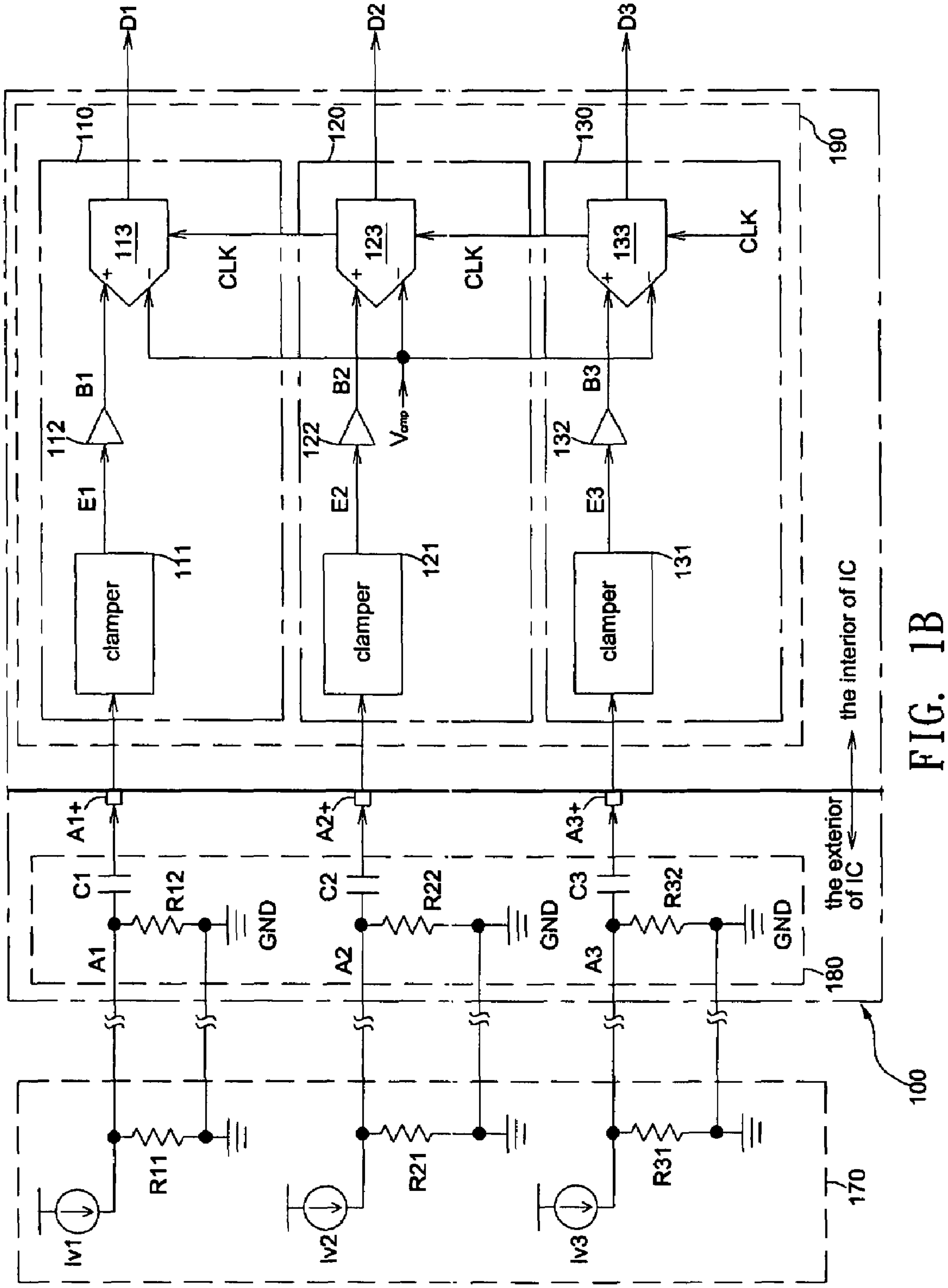
FIG. 1B shows a schematic circuit diagram illustrating an image processing device according to the invention.

FIG. 1B shows a schematic circuit diagram illustrating an image processing device according to the invention. Referring to FIG. 1B, an image processing device 100 of the invention receives and processes an analog image signal from a display card to generate at least one digital signal (D1, D2, D3), wherein the analog image signal includes at least one analog image signal (e.g., A1, A2 and A3. Note that the invention is not limited to the specific image signal types described above). The image processing device 100 includes a peripheral circuit 180 and a pseudo-differential AFE circuit 190. The peripheral circuit 180, having a ground terminal GND, is electrically coupled to a display card 170 for transmitting analog image signals (A1, A2, A3). The pseudo-differential AFE circuit 190 and the peripheral circuit 180 are electrically coupled to each other. With pseudo-differential inputs as shown in FIG. 1B, the pseudo-differential AFE circuit 190 needs only three pins A1+, A2+, A3+ to receive the analog image signals.

Figure 2:
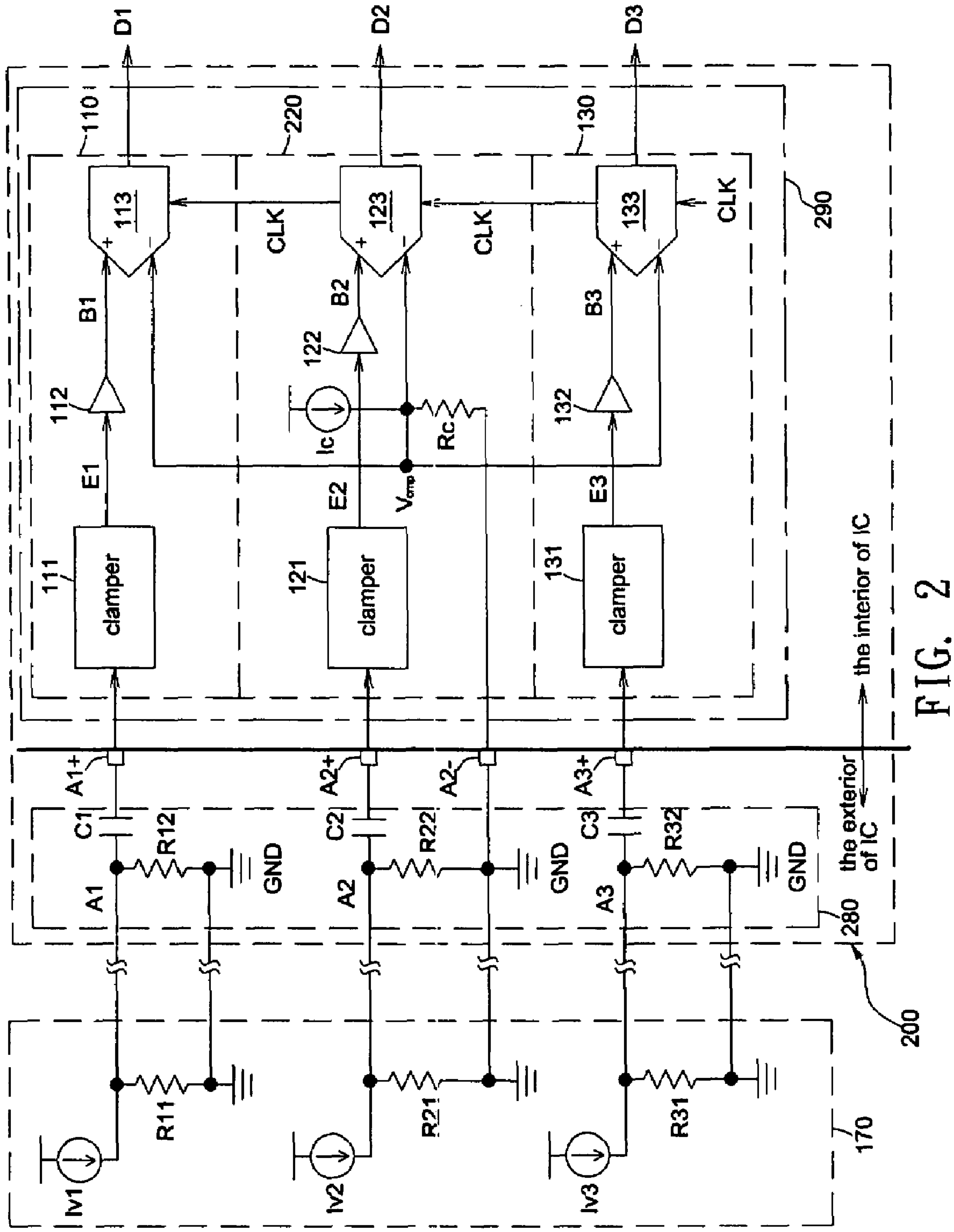
FIG. 2 shows a schematic circuit diagram of an image processing device according to a first embodiment of the invention.

FIG. 2 shows a schematic circuit diagram of an image processing device according to a first embodiment of the invention. Referring to FIG. 2, an image processing device 200 of the invention, including a peripheral circuit 280 and a pseudo-differential AFE circuit 290, receives and processes analog image signals A1, A2, A3 from a display card 170 to generate digital signals D1, D2, D3. The pseudo-differential AFE circuit 290 includes three converting circuits 110, 220, 130, wherein the converting circuit 220 includes a clamper 121, an input buffer 122, a variable current source $I_c$, a resistor $R_c$ and an ADC 123. The components included in the converting circuit 220 are substantially the same as those included in the converting circuit 120 and a difference between the converting circuit 220 and the converting circuit 120 is that the variable current source $I_c$ is connected in series with the resistor $R_c$ to form the comparing voltage $V_{cmp}$, which will be simultaneously fed to the ADCs 113, 123, 133. The negative terminals of the three ADCs 113, 123, 133 share a common circuit including the variable current source $I_c$ and the resistor $R_c$, therefore reducing the size and the power consumption of the overall circuit. Besides, the architecture of the first embodiment renders a better image quality since the negative input terminals of the ADCs 113, 123, 133 are referenced to the ground voltage GND of the peripheral circuit 280 via an additional pin A2−, which is shared by three channels A1, A2, A3. In this embodiment, a total of four pins A1+, A2+, A3+, A2− are required for the pseudo-differential AFE circuit 290 to receive the analog image signals. Furthermore, the comparing voltage $V_{cmp}$, implemented by the variable current source $I_c$ in series connection with the resistor $R_c$, can be sent to input buffers (not shown) for buffering before being fed to the ADCs (113, 123, 133) in order to increase driving capability. On the other hand, in practical applications, the variable current source $I_c$ and the resistor $R_c$ are not necessarily disposed in the converting circuit 220, but in either of the converting circuits 110, 130.

It should be noted that, in the first embodiment, the negative input terminals of the three ADCs 113, 123, 133 can be also referenced to the internal ground (inside the IC) that is shared by three channels A1, A2, A3 (not shown), thereby replacing the architecture having an additional pin A2− (shown in FIG. 2) connected to an external ground (outside the IC) and maintaining the same image quality. This is because the common-mode noise between the positive input terminal and the negative input terminal can be counteracted by means of the use of the pseudo-differential input structure, accordingly saving the pin A2−.

Figure 3:
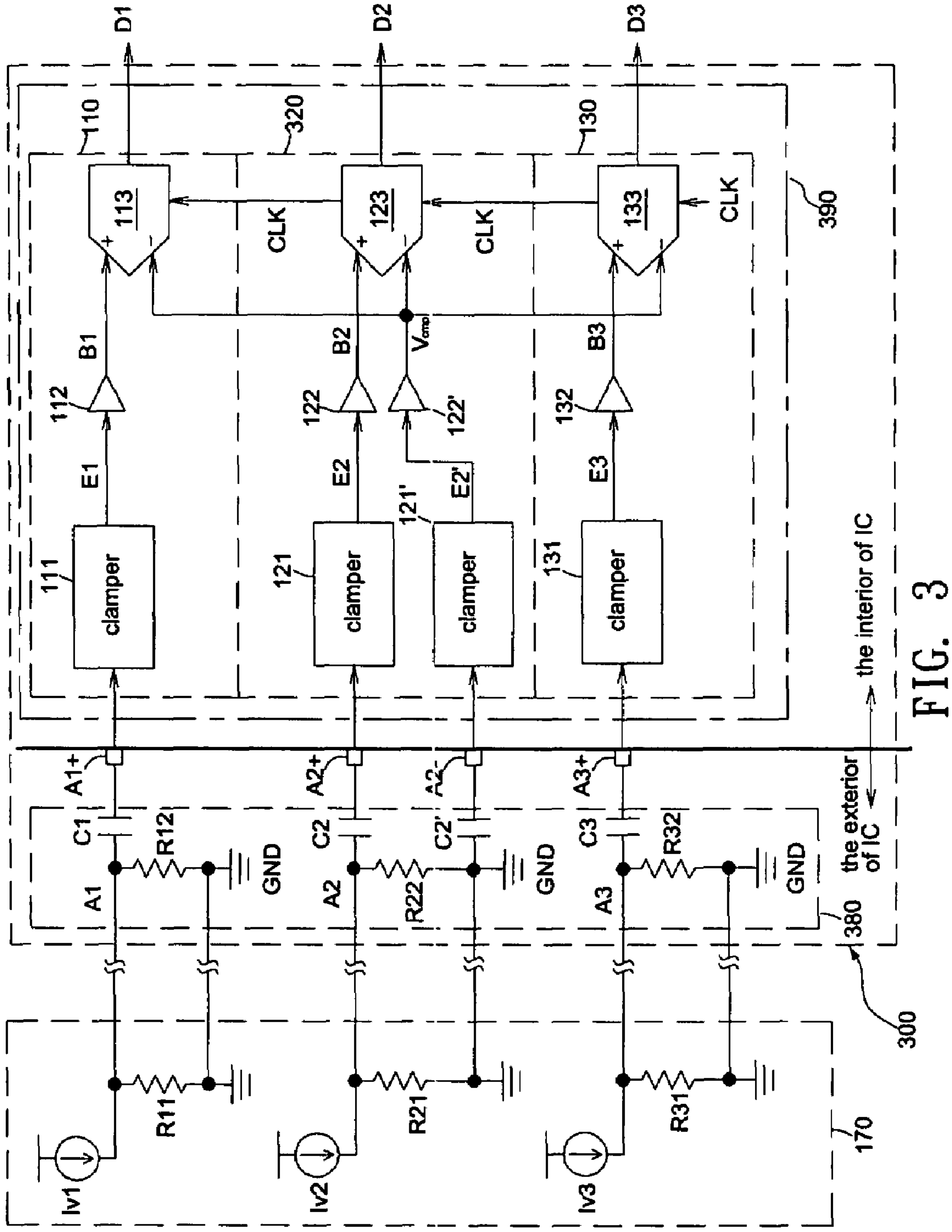
FIG. 3 shows a schematic circuit diagram of an image processing device according to a second embodiment of the invention.

FIG. 3 shows a schematic circuit diagram of an image processing device according to a second embodiment of the invention. Referring to FIG. 3, an image processing device 300 of the invention, including a peripheral circuit 380 and a pseudo-differential AFE circuit 390, receives and processes analog image signals A1, A2, A3 from a display card 170 to generate digital signals D1, D2, D3. Two capacitors C2, C2' are installed in the channel A2 of the peripheral circuit 380. The pseudo-differential AFE circuit 390 includes three converting circuits 110, 320, 130, wherein the converting circuit 320 includes two clampers 121, 121', two input buffers 122, 122' and an ADC 123. The clamper 121' receives a ground voltage GND of the peripheral circuit 380, restores its DC voltage level and generates an restored signal $E'_2$. Then, the input buffer 112' buffers the restored signal $E'_2$ and then generates the comparing voltage $V_{cmp}$. This embodiment has an input structure closest to the fully-differential input structure since the front-end circuits, connected to the positive input terminal and the negative input terminal of the ADC 123 respectively, have the most symmetrical circuit configuration.

The analog image signal A2 (hereinafter called "A2+") and its corresponding ground voltage GND (hereinafter called "A2−") pass capacitors $C_2$, $C'_2$, clampers 121, 121' and input buffers 122, 122', simultaneously and respectively. Certainly, the second embodiment also has features of a smaller size and less power consumption since the negative input terminals of the ADCs 113, 123, 133 share a common front-end circuit including a capacitor $C'_2$, a clamper 121' and an input buffer 122'. In this embodiment, a total of four pins A1+, A2+, A3+, A2− are required for the pseudo-differential AFE circuit 390 to receive the analog image signals. In practical applications, the capacitor $C'_2$, the clamper 121' and the input buffer 122' are not necessarily installed in the channel A2 of the peripheral circuit 380 plus the converting circuit 320, but in either the channel A1 of the peripheral circuit 380 plus the converting circuit 110 or the channel A3 of the peripheral circuit 380 plus the converting circuit 130.

It should be noted that, in the second embodiment, the negative input terminals of the three ADCs 113, 123, 133 can be also referenced to the internal ground (inside the IC) that is shared by three channels A1, A2, A3 (not shown), thereby replacing the architecture having an additional pin A2− (shown in FIG. 3) connected to an external ground (outside the IC) and maintaining the same image quality. This is because the common-mode noise between the positive input terminal and the negative input terminal can be counteracted by means of the use of the pseudo-differential input structure, accordingly saving the pin A2−.

Figure 4:
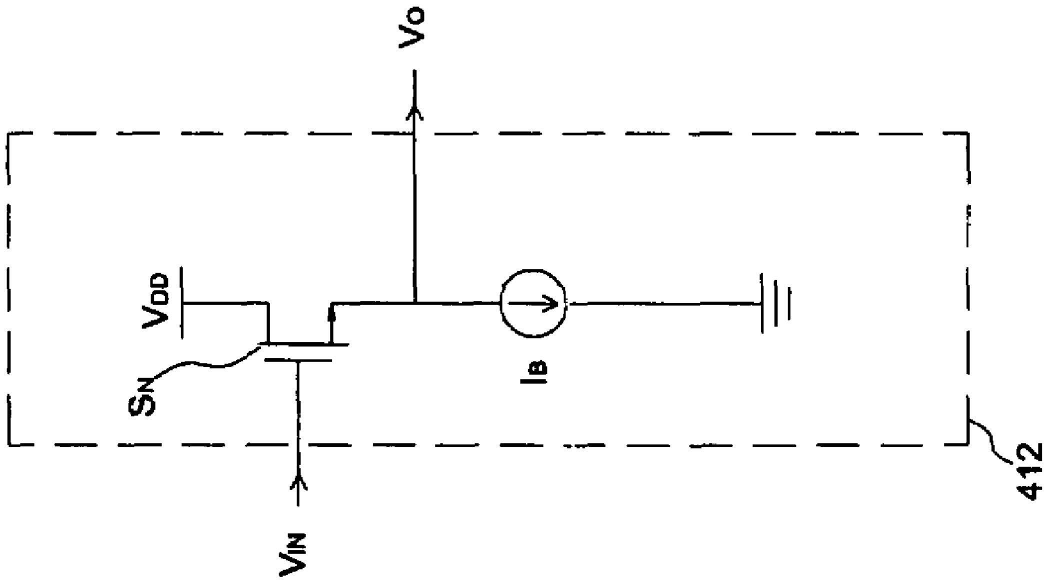
FIG. 4 shows a schematic circuit diagram of an input buffer according to the invention.

FIG. 4 shows a schematic circuit diagram of an input buffer according to the invention. According to the invention, based on the feature of the pseudo-differential input structure and a constant voltage difference between the positive input terminal and the negative input terminal, voltage levels at the positive input terminals and the negative input terminals of the ADCs 113, 123, 133 can be pulled up towards $V_{dd}$ at the same time. The pulled-up voltage levels at the positive input terminals and the negative input terminals of the ADCs 113, 123, 133 will satisfy a requirement that NMOS source followers usually have a higher input voltage. Accordingly, a NMOS source follower $S_N$ is connected in series to a current source $I_B$ to construct an input buffer 412. Thus, the input buffer 412 achieves a better performance and a lower power consumption after the NMOS source follower $S_N$ is substituted for the PMOS source follower $S_P$. It should also be noted that in practice, the drain terminal of the NMOS source follower $S_N$ is usually coupled to $V_{dd}$ via a resistor or a PMOS transistor under consideration to the effect of electrostatic discharge (ESD).

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A pseudo-differential analog front end (AFE) circuit for receiving at least one analog image signal and generating at least one digital signal, wherein the pseudo-differential AFE circuit comprises at least one converting circuit and each converting circuit comprises:

a first clamper for receiving the analog image signal and restoring a DC voltage level of the analog image signal to generate a first restored signal;

a first input buffer for buffering the first restored signal and generating a buffered signal; and an analog-to-digital converter (ADC) having a positive input terminal and a negative input terminal, one of which receives the buffered signal and the other of which receives a comparing voltage, wherein the analog-to-digital converter converts a voltage difference between the two input terminals into the digital signal;

wherein each of the analog-to-digital converters receives a common comparing voltage while the number of the at least one converting circuit is greater than one.

2. The pseudo-differential analog front end circuit according to claim 1, which is disposed in a liquid crystal display controller and comprises three of the at least one converting circuit.

3. The pseudo-differential analog front end circuit according to claim 1, which is disposed in a video decoder.

4. The pseudo-differential analog front end circuit according to claim 1, wherein the first input buffer comprises:

a variable current source having one terminal coupled to ground; and a NMOS transistor having its drain coupled to a power supply voltage, its source coupled to the other terminal of the variable current source and its gate receiving the first restored signal.

5. The pseudo-differential analog front end circuit according to claim 1, wherein one of the at least one converting circuit further comprises:

a second clamper for receiving a ground voltage corresponding to the analog image signal fed into the converting circuit and restoring a DC voltage level of the ground voltage to generate a second restored signal; and a second input buffer buffering the second restored signal and generating the comparing voltage.

6. The pseudo-differential analog front end circuit according to claim 5, wherein the second input buffer comprises:

a variable current source having one terminal coupled to ground; and a NMOS transistor having its drain coupled to a power supply voltage, its source coupled to the other terminal of the variable current source and its gate receiving the second restored signal.

7. The pseudo-differential analog front end circuit according to claim 1, wherein one of the at least one converting circuit further comprises:

a variable current source having one terminal coupled to a power supply voltage; and a resistor having one terminal coupled in series to the other terminal of the variable current source to form an input node, wherein the input node provides the comparing voltage and the other terminal of the resistor is coupled to a ground voltage corresponding to the analog image signal.

8. An image processing device for processing at least one analog image signal fed from a display card and generating at least one digital signal, comprising:

a peripheral circuit having a ground terminal and electrically coupled with the display card for transmitting the at least one analog image signal; and a pseudo-differential analog front end circuit electrically coupled to the peripheral circuit and comprising at least one converting circuit, wherein each of the at least one converting circuit comprises:

a first clamper for receiving the analog image signal and restoring a DC voltage level of the analog image signal to generate a first restored signal;

a first input buffer for buffering the first restored signal and generating a buffered signal; and an analog-to-digital converter having a positive input terminal and a negative input terminal, one of which receives the buffered signal and the other of which receives a comparing voltage, wherein the analog-to-digital converter converts a voltage difference between the two input terminals into the digital signal;

wherein each of the analog-to-digital converters receives a common comparing voltage while the number of the at least one converting circuit is greater than one.

9. The image processing device according to claim 8, which is disposed in a liquid crystal display controller and comprises three of the at least one converting circuit.

10. The image processing device according to claim 8, which is disposed in a video decoder.

11. The image processing device according to claim 8, wherein the first input buffer comprises:

a variable current source having one terminal coupled to ground; and a NMOS transistor having its drain coupled to a power supply voltage, its source coupled to the other terminal of the variable current source and its gate receiving the first restored signal.

12. The image processing device according to claim 8, wherein one of the at least one converting circuit further comprises:

a second clamper coupled to the ground terminal of the peripheral circuit for generating a second restored signal; and a second input buffer for buffering the first restored signal and generating the comparing voltage.

13. The image processing device according to claim 12, wherein the wherein the second input buffer comprises:

a variable current source having one terminal coupled to ground; and a NMOS transistor having its drain coupled to a power supply voltage, its source coupled to the other terminal of the variable current source and its gate receiving the second restored signal.

14. The image processing device according to claim 8, wherein one of the at least one converting circuit further comprises:

a variable current source having its one terminal coupled to a power supply voltage; and a resistor having one terminal coupled in series to the other terminal of the variable current source to form an input node, wherein the input node provides the comparing voltage and the other terminal of the resistor is coupled to the ground terminal of the peripheral circuit.

15. The image processing device according to claim 8, which is disposed on a printed circuit board.

* * * * *